United States Patent [19]

Millea et al.

[11] 4,232,221

[45] Nov. 4, 1980

[54] METHOD AND APPARATUS FOR TRIMMING IR/CCD MOSAIC SENSORS

[75] Inventors: Michael F. Millea, Manhattan Beach; David H. Seib, Costa Mesa, both of Calif.

[73] Assignee: The United States of America as represented by the Secretary of the Air Force, Washington, D.C.

[21] Appl. No.: 5,111

[22] Filed: Jan. 22, 1979

[51] Int. Cl.³ ..................... G01N 23/00; H01J 37/00
[52] U.S. Cl. ................... 250/311; 250/492 A
[58] Field of Search ............ 250/306, 307, 396, 397, 250/398, 492 A, 492 B; 324/158 D; 357/91, 59

[56] References Cited

U.S. PATENT DOCUMENTS

| | | | |
|---|---|---|---|
| 2,931,931 | 4/1960 | Lubszynski et al. | 250/307 |
| 3,448,377 | 6/1969 | Seiwatz et al. | 250/306 |
| 3,531,716 | 9/1970 | Tarui et al. | 250/307 |
| 3,772,520 | 11/1973 | Varker | 250/307 |

*Primary Examiner*—Bruce C. Anderson
*Attorney, Agent, or Firm*—Joseph E. Rusz; William Stepanishen

[57] ABSTRACT

A method and apparatus for trimming IR/CCD mosaic sensors by establishing a threshold level for the input gates of the CCD unit and then setting all the input gates of the device to the same threshold level.

5 Claims, 2 Drawing Figures

METHOD AND APPARATUS FOR TRIMMING IR/CCD MOSAIC SENSORS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to IR/CCD mosaic sensors, and in particular to a method and apparatus for trimming threshold levels with the IR/CCD mosaic sensors.

In the field of spy satellite, advanced space surveillance systems which are operated in the infrared (IR) region, employ high density mosaic sensors to obtain surveillance data. The most well known prior art mosaic array that is utilized in these applications, is an IR/CCD area sensor. In such a system, a scene is imaged with a high density array of IR sensors. The change coupled device CCD, which is coupled to the individual IR detectors, is used to transfer the information from the focal plane. The use of a CCD readout minimizes the number of connections to the focal plane, which must be cooled for sensitive IR operation. One of the major difficulties which is inherent in IR/CCD mosaic sensors is the non-uniformity of response between the individual IR elements. Unlike conventional IR systems, such as a line array, with an IR/CCD area imaging array, it is not possible to individually adjust the detector bias level in order to achieve uniformity.

The difficulties associated with the detectors's resistance non-uniformities can be eliminated by adding additional circuit elements such as a resistance divider network which is connected between a bias supply and ground, and is connected between the detector and input gate. In addition, a decoupling means, such as a capacitor, must be utilized between the detector network and the biasing network input gate which may be set at threshold level by the off-focal plane biasing network. The steady state bias level on the detector does not influence the input gate, whereas a transient IR signal is transmitted to the input gate. However, there are several disadvantages with this procedure. This approach requires more on-chip area for the decoupling capacitor and providing the bias lead to the input gate. This extra on-chip area will substantially decrease the achievable packing density. The bias circuit also represents an additional power drain. While the modification to the circuit would minimize the influence of detector/load resistance variations, it would not eliminate responsivity non-uniformities or threshold voltage non-uniformities at the gate when one biasing network is utilized for many gates. The present apparatus and method provide a means of overcoming the above prior art shortcoming by improving the uniformity of IR/CCD mosaic sensors.

SUMMARY OF THE INVENTION

The present invention utilizes a scanning electron microscope within whose coordinate system is registered an infrared charge coupled device mosaic array sensor. With the IR/CCD sensor operating, the scanning election microscope provides the means to irradiate any region of the IR/CCD sensor with kilovolt electrons. By examining the IR/CCD output, the minimum detector bias which is required to set some of the input gates at threshold may be determined. The input gates which are below threshold may then be irradiated to introduce a positive charge into the insulating region and bring all input gates to the same threshold level. The effect of responsivity non-uniformity may also be reduced by irradiating a region of the input gate, thereby reducing its effective area and correspondingly the gain at the input gate of the CCD sensor.

It is one object of the present invention, therefore, to provide an improved method and apparatus for trimming IR/CCD mosaic sensors.

It is another object of the invention to provide an improved IR/CCD mosaic sensor trimming apparatus wherein the input gate threshold levels of the charge coupled device are adjusted to substantially the same level.

It is still another object of the invention to provide an improved IR/CCD mosaic sensor trimming apparatus wherein the effect of responsivity non-uniformity is reduced by irradiating a region of the input gate to reduce its area.

It is another object of the invention to provide a new and improved IR/CCD mosaic sensor trimming apparatus having improved performance characteristics over the prior art.

These and other advantages, objects and features of the invention will become more apparent after considering the following description taken in conjunction with the illustrative embodiment in the accompanying drawings

DESCRIPTION OF THE PREFERRED EMBODIMENT

Figure 1:
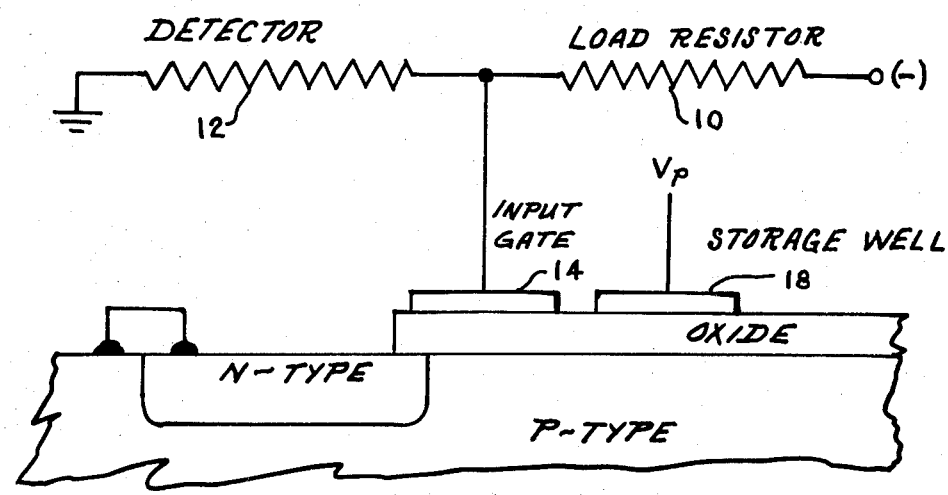
FIG. 1 is a schematic diagram of an IR/CCD sensor of the type used in the present art, and, FIG. 2 is a block diagram of the IR/CCD mosaic sensor trimming apparatus according to the present invention.

Referring now to FIG. 1 there is shown an infrared/-charge coupled device (IR/CCD) comprising an infrared detector network connected to a charge coupled device (CCD). The infrared detector network which is connected between a bias network (not shown) and ground, comprises a series combination of a load resistor 10 and an IR detector 12. The input gate 14 of the CCD unit is connected between the IR detector 12 and the load resistor 10. For the following example, it may be assumed that the detector 12 and load resistance 10 are equal for no-signal radiation falling on the photoconductor. It may also be assumed that $V_A/2$ is the turn-on voltage of the input gate 12. When signal radiation is absorbed by the detector 12, the input gate 14 voltage will drop and electrons will transfer from the diffused n-type region 16 to the storge well 18. A positive voltage, $V_p$ is applied to the storage well 18 electrode. The amount of charge collected in the storage well 18 will be proportional to the IR radiation absorbed. After a suitable integrating time, the charge collected in the storage well 18 will be transferred into the readout channel (not shown) and clocked out.

In the case where the detector 12 resistance is higher than the average value by $\Delta R$. The input gate 14 will be different than the turn-on voltage $V_A/2$ by an amount:

$$\Delta V \approx (V_A/2)(\Delta R/R).$$

The voltage, $V_A$, applied to the load resistor is negative in order to properly control the gate. The voltage $\Delta V$ corresponds to a signal power of:

$$P_{sig}=(V_A/2R_V)(\Delta R/R)$$

where $R_V$ is the voltage responsivity of the photoconductors. Typical values appropriate to PbS photoconductors are:

$$V_A = -10 \text{ V}$$

$$R_V = 2 \times 10^9 \text{ volts/watts}$$

$$\Delta R/R = 0.05$$

which gives $$P_{sig} \approx 10^{-10} \text{ watts,}$$

a value $10^5$ times higher than the NEP. If a decreased bias is applied to the load resistor 10, then this individual element would have its input gate 14 at threshold for no-signal, while other gates in a complete system would be above or below threshold with no signal absorbed.

Figure 2:
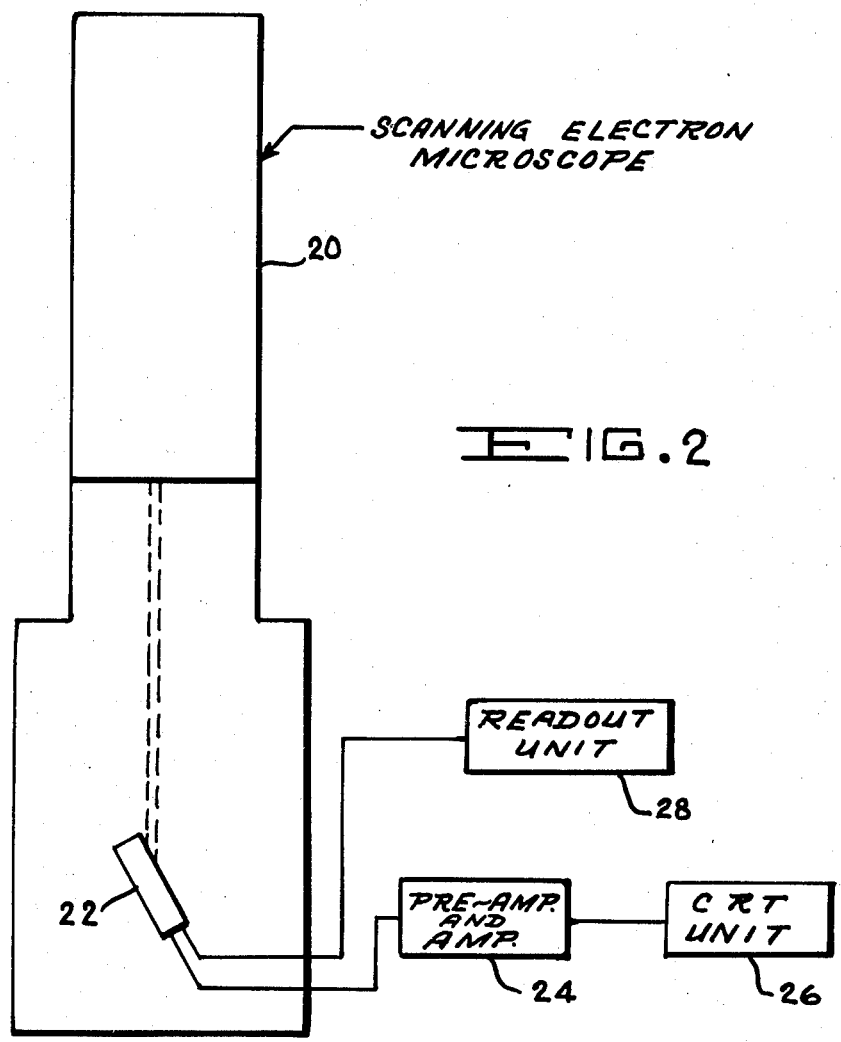

Turning now to FIG. 2, there is shown a scanning electron microscope 20 having indexed therein an IR/CCD mosaic sensor unit 22. The IR/CCD mosaic sensor unit 20 is in registration with the coordinate system of the scanning electron microscope 20 so that any region of the IR/CCD unit may be irradiated by a preselected amount kilovolt electrons. The scanning electron microscope includes a pre-amp and amplifier unit 24 and a CRT display unit 26. A readout unit 28 which is connected to the IR/CCD unit 22, monitors the operation of the IR/CCD unit. In the present example, it is assumed that the IR detectors on sensors array unit 22 are coupled to the CCD array as shown in FIG. 1. By operating the IR/CCD unit 22 and examining the various IR/CCD output, it is possible to determine the minimum detector bias which is required to set some of the input gates at threshold. However, there will be some input gates that are below the input gate threshold level. By selectively irradiating the input gates which are below threshold, it is possible to introduce positive charge into the insulating region and thereby bring all input gates to their threshold voltage.

The influence of responsivity non-uniformity may be altered in the following manner. First, a p-channel CCD is utilized and not the n-channel device as shown in FIG. 1. This modification may be accomplished by interchanging the IR detector and load resistor and also interchanging the doping in the silicon substrate. Now increase the bias to the detector network to place substantially all input gates at or above threshold. Then, by selectively irradiating all input gates which are above their threshold voltage, all gates are placed at threshold.

The effect of responsivity non-uniformity may also be reduced by the following method. A reasonable signal is placed on all IR detectors. The output signal from the individual pixels will vary due to the variation in the IR detector's responsivity. The output signal from a given pixel will depend not only on the IR detector's responsivity but also on the gain at the input gate, which depends on the effective area of the input gate. By irradiating a region of the input gate, it is possible to reduce the effective area of the gate and thereby reduce the gain at the input gate to the CCD. The area of the input gate irradiated is proportional to the ratio of its initial output to a selected lower limit. Although the average responsivity may be reduced by this procedure, the average sensitivity should not be seriously degraded.

Although the invention has been described with reference to a particular embodiment, it will be understood to those skilled in the art that the invention is capable of a variety of alternative embodiments within the spirit and scope of the appended claims.

What is claimed is:

1. A threshold level trimming apparatus for IR/CCD mosaic sensors comprising in combination:
   a scanning electron microscope for irradiating a specimen, said scanning electron microscope producing an electron beam output, said scanning electron microscope including a cathode ray tube unit for visual observation of said specimen,
   an IR/CCD sensor unit comprising a plurality of IR/CCD mosaic sensors, said IR/CCD sensor unit being positioned in said scanning electron microscope for exposure to said electron beam output, said IR/CCD sensor unit being registered within the scanning electron microscope coordinate system to permit any region of said IR/CCD sensor unit to be irradiated, a bias level being applied to each of said plurality of IR/CCD mosaic sensors, some of said plurality of IR/CCD mosaic sensors producing an output signal, said bias level being increased until each of said plurality of IR/CCD mosaic sensors produce an output signal, the bias level which produces an output signal in each of said plurality of IR/CCD mosaic sensors being the established threshold level, and,
   a readout unit connected to said IR/CCD sensor unit to indicate the output signal in each of said plurality of IR/CCD mosaic sensors, each of said plurality of IR/CCD mosaic sensors having an input gate which is positioned on an insulating region, said scanning electron microscope irradiating the insulating region of each of said IR/CCD mosaic sensors whose threshold level is below the established threshold level to introduce a positive charge into said insulating region and bring all input gates to the same threshold level for a no-signal condition.

2. A threshold level trimming apparatus as described in claim 1 wherein each of said plurality of IR/CCD mosaic sensors comprise in combination:
   a detector network comprising an IR detector in series with a load resistor, said detector network receiving a bias signal at said load resistor, one end of said IR detector being connected to ground, and,
   a CCD unit comprising an input gate connected to the junction of said IR detector and said load resistor, a substrate of a first type, a doped region in said substrate of a second type, an oxide layer on said substrate extending over a position of said doped region, and a storage well connected to a voltage source, said input gate and said storage well each being in direct electrical contact to said oxide layer but not in direct electrical contact to each other.

3. A threshold level trimming apparatus as described in claim 2 wherein said input gates of each of said plurality of IR/CCD mosaic sensors which are below the established threshold level are irradiated individually until the established threshold level is reached.

4. A threshold level trimming apparatus as described in claim 2 wherein said substrate is comprised of p-type material, said doped region is comprised of n-type material and in said detector network, the IR detector and load resistor positions are interchanged.

5. A threshold level trimming apparatus as described in claim 4 wherein the insulating region of an input gate is irradiated to introduce a positive charge into said insulating region to reduce its effective area thereby reducing the gain at the input gate.

* * * * *